(12) United States Patent
Chiang

(10) Patent No.: US 7,688,589 B2
(45) Date of Patent: Mar. 30, 2010

(54) WATER COOLED HEAT DISSIPATION MODULE FOR ELECTRONIC DEVICE

(75) Inventor: Kuei-Fung Chiang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 181 days.

(21) Appl. No.: 11/933,595

(22) Filed: Nov. 1, 2007

(65) Prior Publication Data

US 2009/0116196 A1 May 7, 2009

(51) Int. Cl.
*H05K 7/20* (2006.01)
*F04B 17/00* (2006.01)

(52) U.S. Cl. ............... 361/699; 361/698; 165/104.28; 165/120; 417/355; 415/175; 415/176

(58) Field of Classification Search .......... 361/695, 361/712, 698, 699; 165/80.4, 104.28, 120; 417/355–357; 415/175, 176

See application file for complete search history.

(56) References Cited

U.S. PATENT DOCUMENTS

| | | | |
|---|---|---|---|
| 6,327,145 B1 * | 12/2001 | Lian et al. ............... 361/697 |
| 6,748,758 B2 * | 6/2004 | Imada et al. ............ 62/259.2 |
| 6,832,646 B1 * | 12/2004 | Uomori et al. .......... 165/80.2 |
| 6,839,234 B2 * | 1/2005 | Niwatsukino et al. ..... 361/695 |
| 6,894,899 B2 * | 5/2005 | Wu et al. ................. 361/699 |
| 6,999,316 B2 * | 2/2006 | Hamman ................. 361/701 |
| 7,016,195 B2 * | 3/2006 | Ito et al. ................. 361/699 |
| 7,055,581 B1 * | 6/2006 | Roy ..................... 165/104.33 |
| 7,117,931 B2 * | 10/2006 | Crocker et al. ........ 165/104.33 |
| 7,209,355 B2 * | 4/2007 | Koga et al. .............. 361/699 |
| 7,249,625 B2 * | 7/2007 | Duan .................... 165/80.4 |
| 7,255,154 B2 * | 8/2007 | Koga et al. ............ 165/104.33 |
| 7,274,566 B2 * | 9/2007 | Campbell et al. ........ 361/699 |
| 7,312,986 B2 * | 12/2007 | Tomioka et al. ........ 361/679.48 |
| 7,371,056 B2 * | 5/2008 | Ito et al. ................. 417/353 |
| 7,379,301 B2 * | 5/2008 | Liu et al. ................ 361/699 |
| 7,539,016 B2 * | 5/2009 | Sauciuc et al. .......... 361/699 |
| 7,544,049 B2 * | 6/2009 | Koga et al. .............. 417/423.8 |
| 2003/0072656 A1 * | 4/2003 | Niwatsukino et al. .... 417/354 |
| 2003/0151130 A1 * | 8/2003 | Cheon ................... 257/712 |
| 2003/0214786 A1 * | 11/2003 | Niwatsukino et al. .... 361/699 |
| 2004/0052663 A1 * | 3/2004 | Laing et al. ............. 417/423.8 |
| 2004/0070942 A1 * | 4/2004 | Tomioka et al. ......... 361/700 |
| 2004/0105232 A1 * | 6/2004 | Ito et al. ................. 361/687 |
| 2004/0240179 A1 * | 12/2004 | Koga et al. .............. 361/699 |
| 2005/0069432 A1 * | 3/2005 | Tomioka ................. 417/423.1 |
| 2005/0168079 A1 * | 8/2005 | Wos ........................ 310/52 |
| 2006/0018775 A1 * | 1/2006 | Oikawa .................. 417/423.14 |
| 2006/0171801 A1 * | 8/2006 | Manabe et al. .......... 415/176 |
| 2006/0185829 A1 * | 8/2006 | Duan et al. ............ 165/104.33 |
| 2006/0185830 A1 * | 8/2006 | Duan .................... 165/104.33 |
| 2007/0000648 A1 * | 1/2007 | Crocker et al. ........ 165/104.33 |

(Continued)

*Primary Examiner*—Anatoly Vortman

(57) ABSTRACT

A heat dissipation module for an electronic device includes a base disk, a suction disk, a water guide and a cover. The base has a containing space and a plurality of cooling strips. The suction base is attached to the base disk and further includes a water chamber for receiving sucked water, an inlet and an outlet. The water guide is attached to the suction disk with a guide port at the periphery thereof. The cover closes the suction disk and is movably joined to a guide fan. When the heat dissipation module is full with fluid, the fluid can flow therein rapidly while the guide fan rotating such that the fluid is discharged from and flows into the heat dissipation module more effectively.

5 Claims, 9 Drawing Sheets

U.S. PATENT DOCUMENTS

2007/0029069 A1* 2/2007 Duan .................. 165/80.4
2007/0103869 A1* 5/2007 Liu et al. ............... 361/699
2007/0193720 A1* 8/2007 Horng et al. ........... 165/104.19
2008/0053641 A1* 3/2008 Lai et al. ................. 165/120

* cited by examiner

WATER COOLED HEAT DISSIPATION MODULE FOR ELECTRONIC DEVICE

BACKGROUND OF THE INVENTION

1. Field of the Invention

The present invention is related to a water cooled heat dissipation module and particularly to a heat dissipation module with which a guide fan is associated for speeding up circulation of cooling water to enhance efficiency of heat exchange.

2. Brief Description of the Related Art

Many electric circuits, which were presented in a form of electronic components, or electronic circuits, which were presented in a form of a plurality of integrated circuits connecting with each other, developed in the early stages has been replaced with a compact integrated circuit due to unceasing progress of the technology of the integrated circuit and the manufacturing process of the semiconductor. In other words, the single compact integrated circuit is capable of performing more functions and is capable of processing more complicated instructions and signals than the integrated circuit developed in the early stages.

The compact integrated circuit contains more electronic components such as FET (Field Effect Transistor) and COMS, more heat is generated when the compact integrated circuit is in operation. The heat generated from the integrated circuit developed in the early stages such as the conventional central processing unit can be dissipated sufficiently with mere cooling fins. However, the heat generated from the compact integrated circuit such as the central processing unit developed in the recent years is unable to be dissipated with the cooling fins only, and a heat dissipating fan becomes a required device in addition to the cooling fins. Normally, the cooling fins have a base for being attached to the integrated circuit such that the heat can be removed outward with the fan, which is disposed at the top of the cooling fin set. Because there is a distance between the base of the cooling fin set and the fan, the heat received by the base is incapable of transmitting to the top of the cooling fin set immediately. As a result, most of the heat accumulates at the base to deteriorate the efficiency of heat dissipation.

In order to increase the efficiency of heat dissipation, guide heat pipes are employed in the cooling fins to speed up removal of the heat with air. Further, the water cooling type heat dissipation is employed to add the water in the guide heat pipes, which are connected to a water tank, and a water pump is disposed to circulate the water between the water tank and the guide heat pipes for enhancing removal of the heat done with the guide heat pipes.

The preceding water cooling type heat dissipation allows the cooling water moving in the guide heat pipes to perform heat exchange in the guide heat pipes. However, the heat generating source such as the central processing unit contacts with the cooling fins directly instead of the guide heat pipes such that the heat received with the cooling fins are still incapable of being dissipated effectively.

SUMMARY OF THE INVENTION

In order to overcome the deficiencies of the preceding prior art, an object of the present invention is to provide a heat dissipation module for an electronic device, which is capable of removing heat of the heat generating component rapidly and providing faster circulation of cooling water.

Accordingly, a heat dissipation module for an electronic device according to the present invention includes a base disk, a suction disk, a water guide and a cover. The suction disk and the water guide are provided between the cover and the base disk. The cover has a receiving shell for receiving a guide fan. The guide fan provides a plurality of blades and a guide opening is disposed between the blades. The base disk has a containing space and a plurality of cooling strips. The suction disk is attached to the base disk and provides a receiving room, an inlet and an outlet. The water guide is attached to the suction disk with a guide port at the periphery thereof. When the heat dissipation module is filled with the fluid, the fluid can flow therein rapidly while the guide fan rotating such that the fluid moves to the water passages in the suction disk and flows into the water guide via the water hole and then flows downward to the containing space of the base disk via the guide port of the water guide and finally is discharged outward with a water pipe after passing through the outlet of the suction disk and the discharge pipe connector of the cover.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
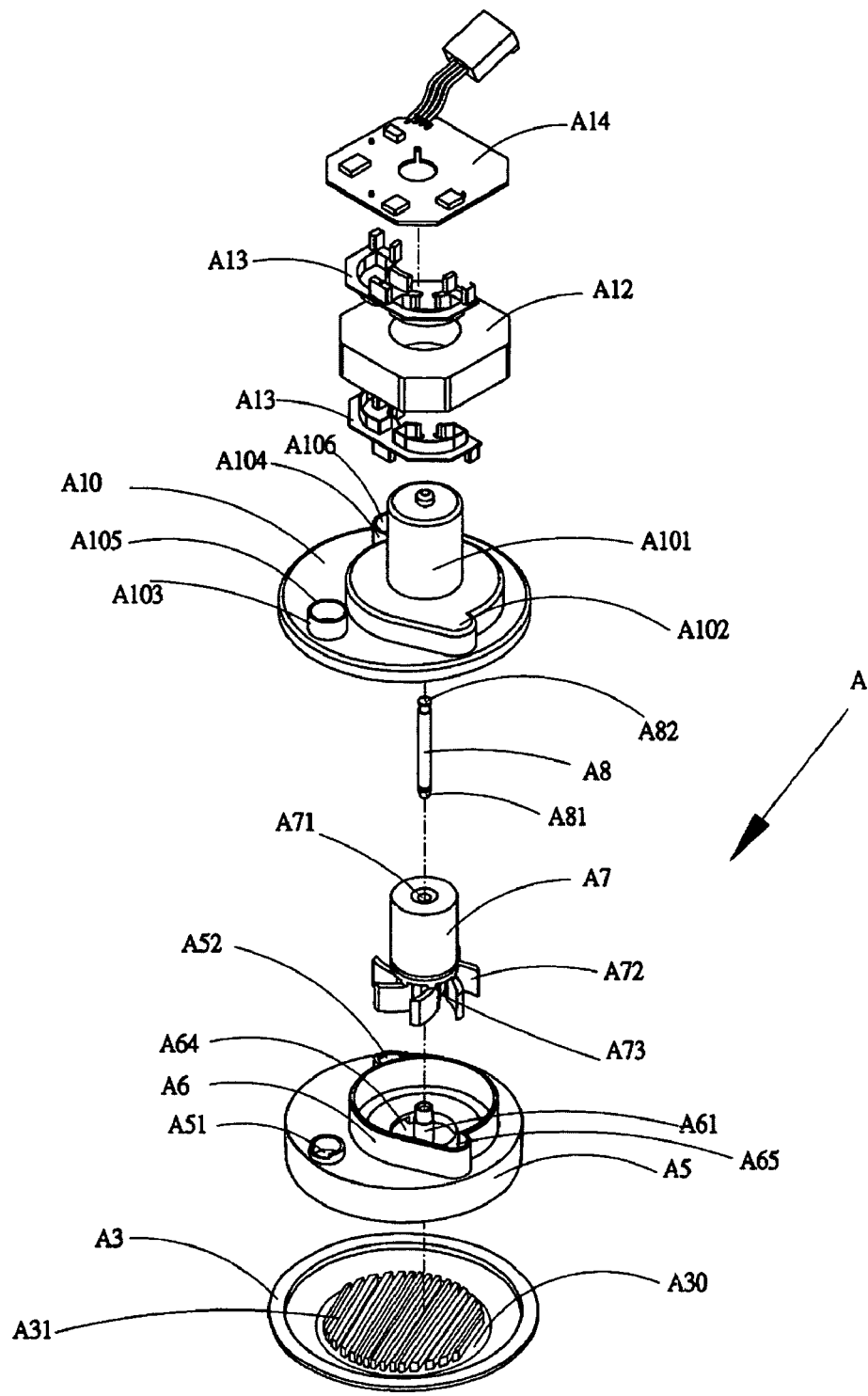
FIG. 1 is an exploded perspective view of a water cooled heat dissipation module for electronic device according to the present invention.

Referring to FIG. 1, the preferred embodiment of a water cooled heat dissipation module according to the present invention includes a water suction disk A5, a base disk A3, a water guide A6, a guide fan A7, a spindle A8, a cover A10, a motor A12, two motor seat A13 and a printed circuit (PC) board A14. Wherein, the base disk A3 has a containing space A30 and a plurality of cooling strips A31;

The water suction disk A5 provides an inlet A51 and an outlet A52 next to the periphery thereof and the inlet A51 and the outlet A52 extend through the thickness of the water suction disk A5 parallel to the axis of the water suction disk A5. A spindle seat A61 is provided to extend upward from the water suction disk A5 eccentrically. The water guide A6 is a circular wall with a center the same as of the spindle seat A61, and integrally joined to the water suction disk A5. The diameter of the water guide is less than that of the water suction disk A5. Further, a water hole A64 at the bottom the water suction disk A5 within the area surrounded by the water guide A6. The water guide A6 has a small circular wall section jutting outward, and a guide port A65 provided at the water suction disk A5 is disposed at the area enclosed by the small circular wall section of the water guide A6 for admitting unidirectional flow of fluid:

A lower end A81 of the spindle A8 is attached to the spindle seat A61 via the center hole A71 of the guide fan A7; and The cover A10 has a size corresponding to the water suction disk A5 for covering the water suction disk A5. An intake pipe connector A103 and a discharge pipe connector A104 are disposed at the cover A10 to match with the inlet A51 and the outlet A52 respectively. The cover A10 further has an upward bulge part A102 corresponding to the water guide A6, and the bulge part A102 has the same contour as the water guide A6 for covering the water guide A6. In addition, a cylindrical receiving shell A101, which extends upward from the bulge part A102, has a common axis with the spindle seat A61 such that a containing space A1021 (see FIG. 4) is formed for accommodating the guide fan A7.

Figure 2:
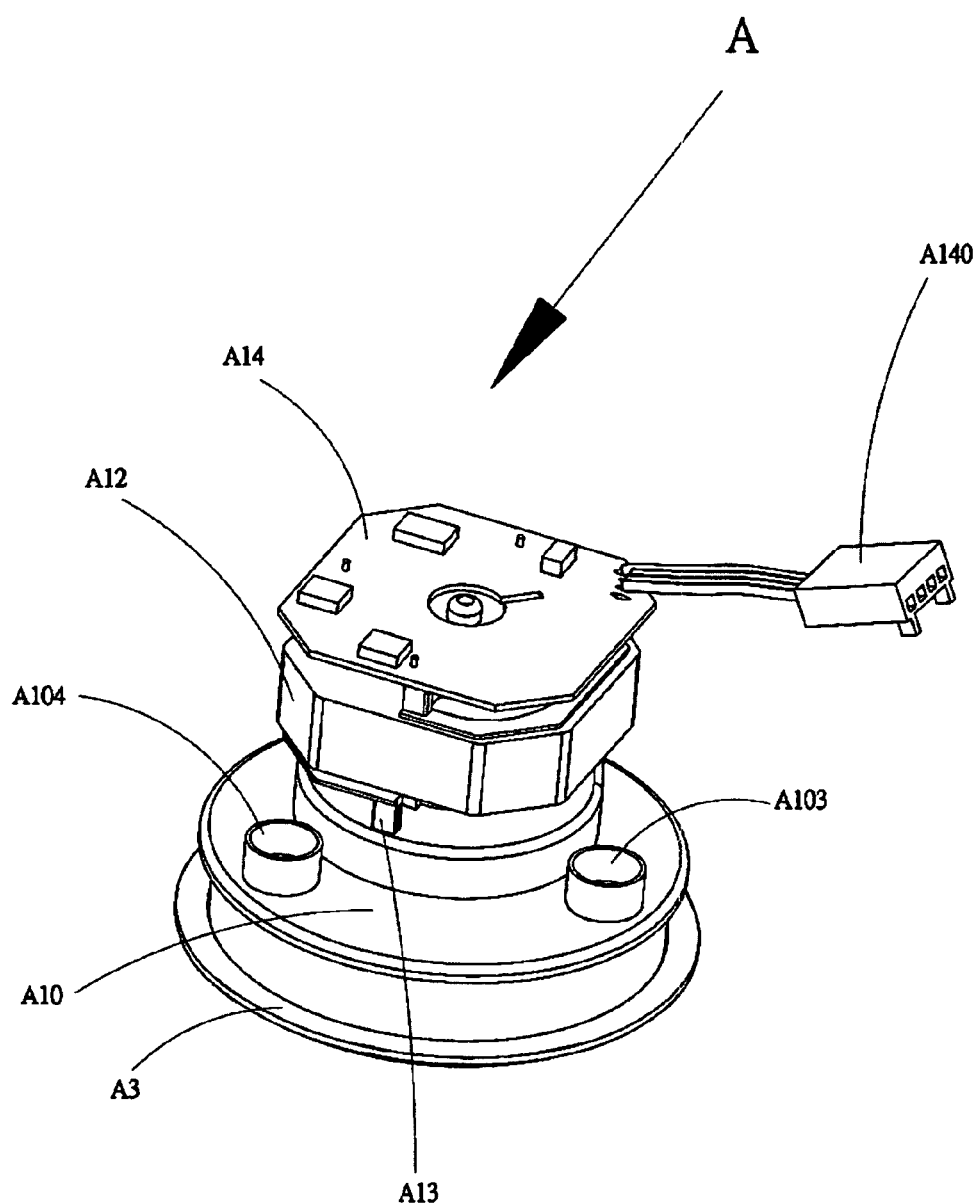
FIG. 2 is an assembled perspective view of FIG. 1.

Referring to FIG. 2, it can be seen that the heat dissipation module A has the PC board A14 with power wiring A140 thereon for supplying power needed by the heat dissipation module A. The motor A12 is provided under the PC board A14 with an inner hole A121 therein being joined to the outer surface of the receiving shell A101 (see FIG. 1). The motor A12 is attached to the upper end A82 of the spindle A8 such that the guide fan A7 is capable of being driven to rotate with the motor A12. The PC board A14 is employed to control actuation of the motor A12. The motor seat A13 is disposed between the motor A12 and the bulge part A102 for securing the motor A12 to the bulge part A102.

Figure 3:
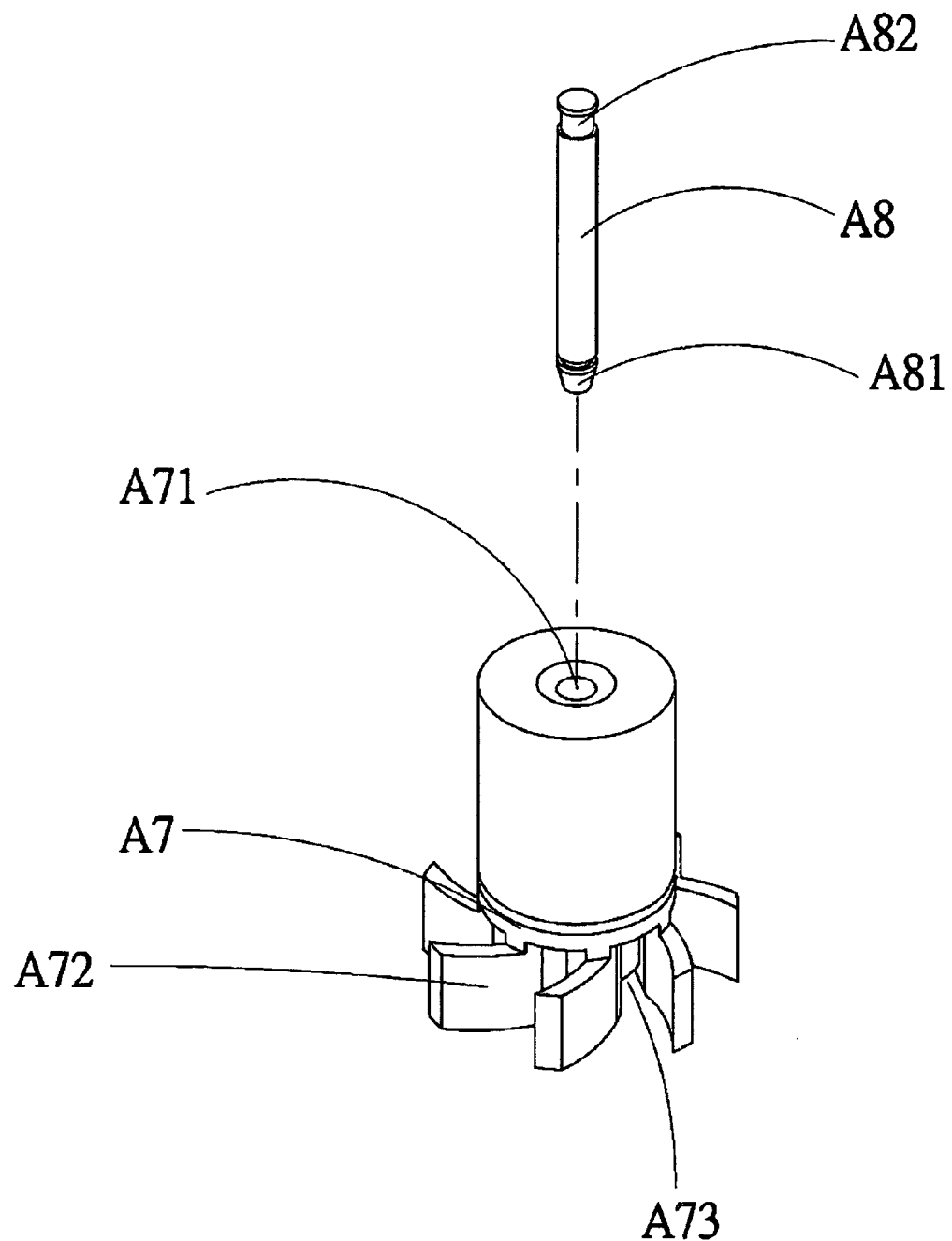
FIG. 3 is an enlarged perspective view of the guide water fan shown in FIG. 1.

Referring to FIG. 3, the lower end A81 of the spindle A8 extends through the inner hole A71 to engage with the guide fan A7 and the upper end A82 of the spindle A8 is joined to the motor A12 (see FIG. 2) such that the guide fan A7 is capable of rotating with the spindle A8 while the spindle A8 is driven with the motor A12. In addition, the blades A72 are capable of rotating with the guide fan A7 such that the fluid, which enters the blades A72 via a guide opening A73, can be guided to a flow direction with the blades A72.

Figure 4:
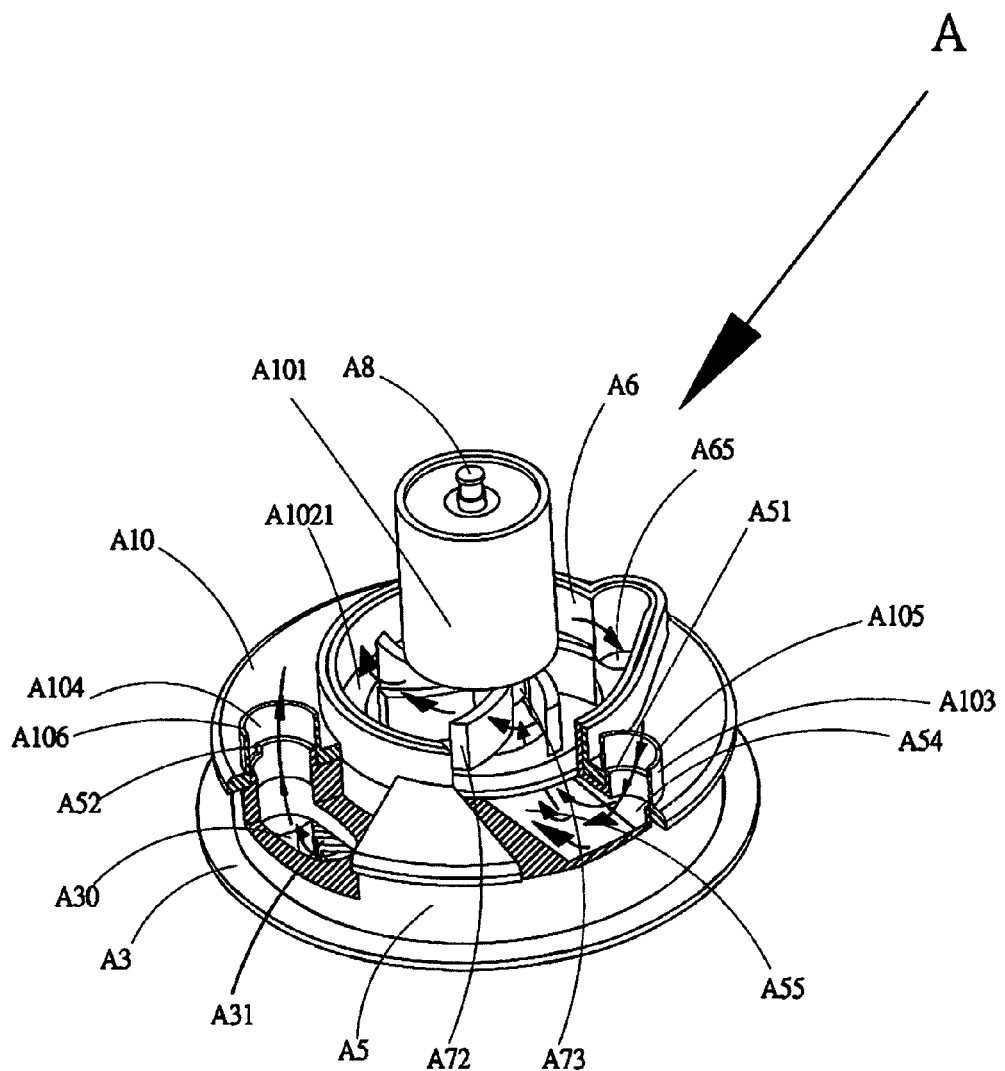
FIG. 4 is a sectional perspective view of the water cooled heat dissipation module of the present invention except the motor and the printed circuit board.
Figure 5:
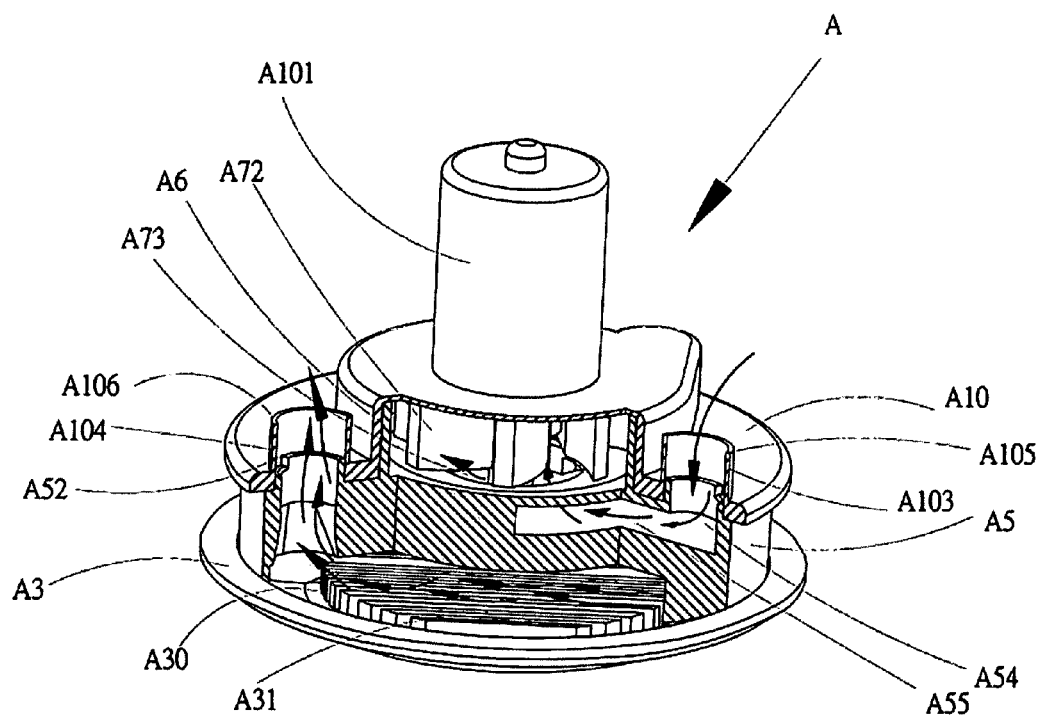
FIG. 5 is another perspective sectional view of the water cooled heat dissipation module of the present invention except the motor and the printed circuit board.

Referring to FIGS. 4 and 5, it can be clearly seen that fluid enters a suction space A54 provided at the suction disk A5 via the inlet A51 of the suction disk A5 after flowing along the intake pipe connector A103 and passing through the intake port A105 of the cover A10. Then, the fluid moves along a water passage A55 to reach the water hole A64 at the bottom of the water guide A6 (see FIG. 1). Hence, the guide opening A73 provided at the guide fan A7 between every two of the blades A72 is capable of guiding the fluid into the guide fan A7 and the blades A72 rotate to carry the water to the guide port A65 unidirectionally for the fluid flowing downward into the containing space A30 of the base disk A3. Heat received by the cooling strips A31 at the bottom of the base disk A3 can be carried outward while the water in the containing space A30 is in a state of moving. The fluid outward the containing space A30 moves to the discharge port A106 at the bottom of the cover A10 via the outlet A52 of the suction disk A5 and leaves the heat dissipation module A via the discharge pipe connector A104 afterward.

Figure 6:
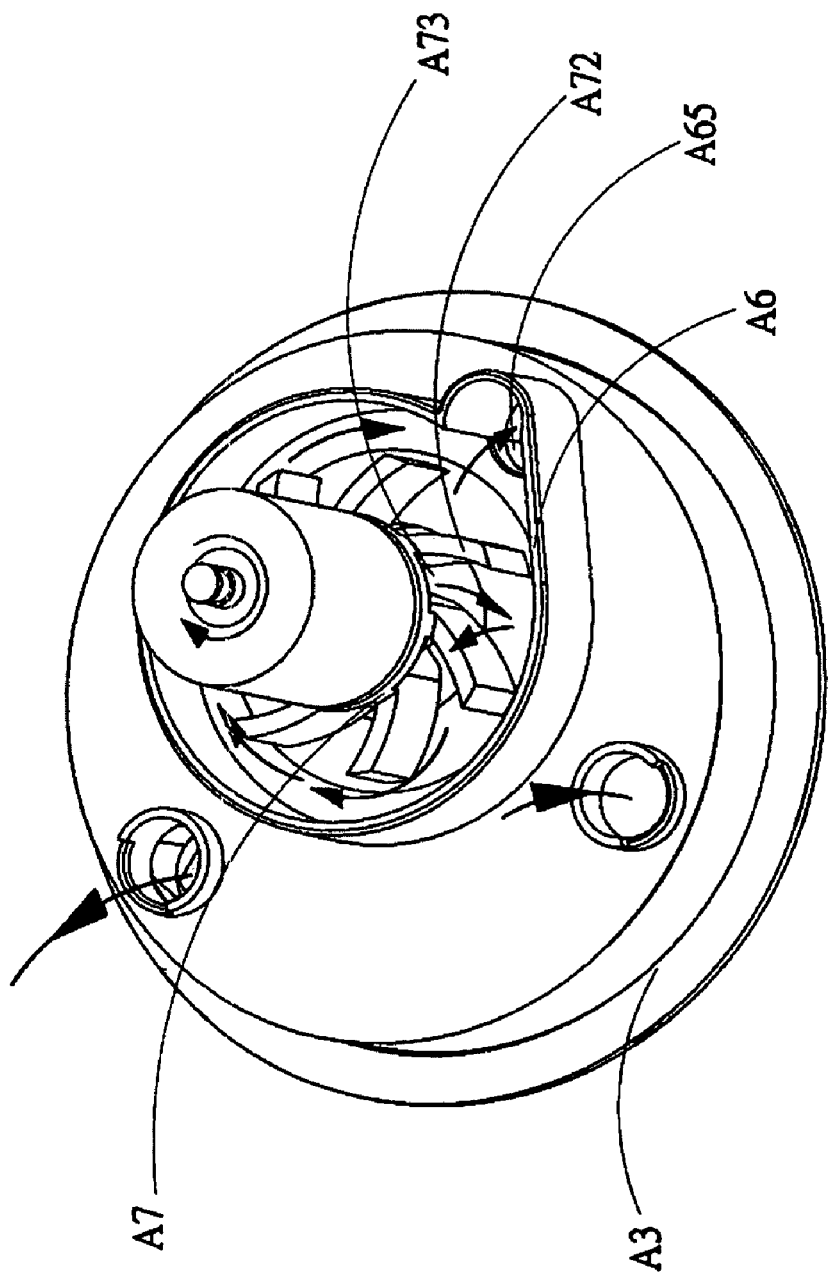
FIG. 6 is a perspective view illustrating operation of the water cooled heat dissipation module of the present invention.

Referring to FIG. 6, it can be seen clearly that after entering the suction disk via the guide opening A73, the fluid is guided to the guide port A65 at the small circular wall section of the water guide A6 before flowing into the base disk A3.

Figure 7:
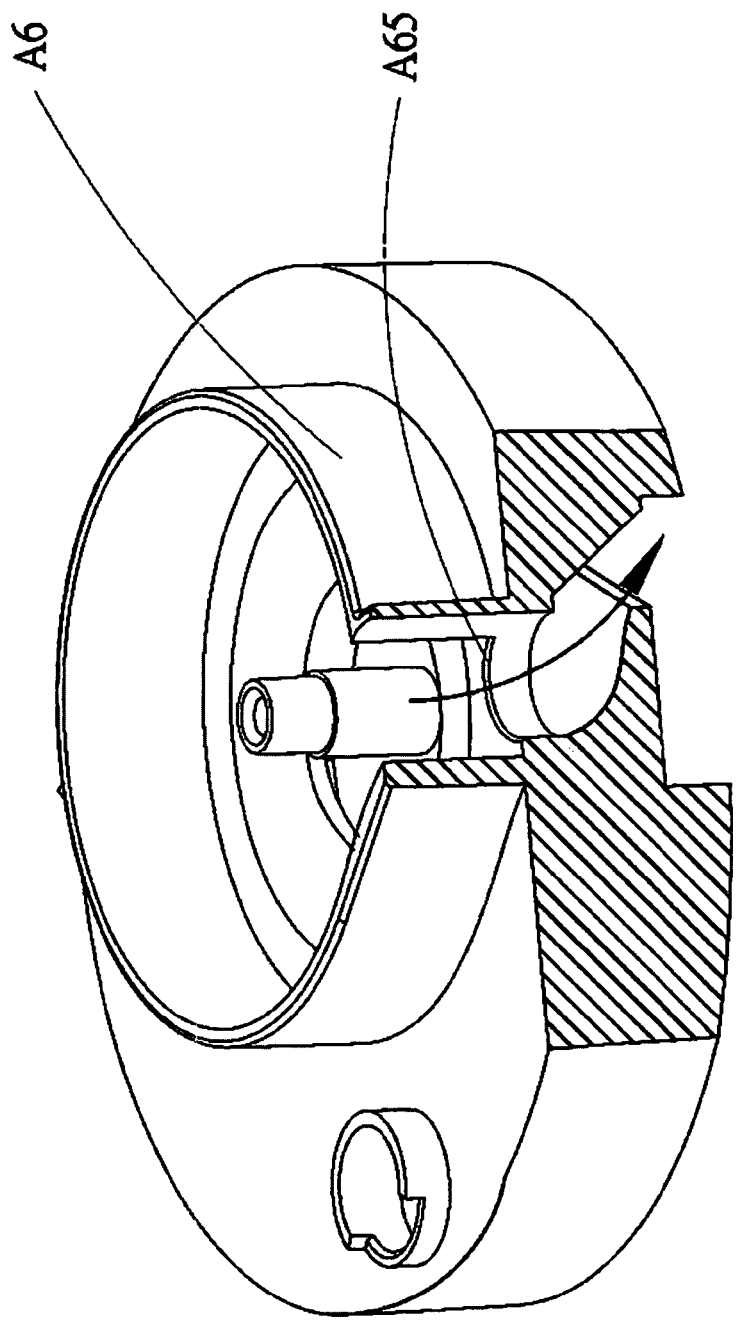
FIG. 7 is a partly sectional perspective view of the water suction disk in the water cooled heat dissipation of the present invention.

Referring to FIG. 7, it can be seen clearly that the guide port A65 provides a mitigating passage A651 for the fluid being capable of moving to the base disk A3 less harshly while the fluid flows to the base disk A3 via the guide port A65 of the water guide A6.

Figure 8:
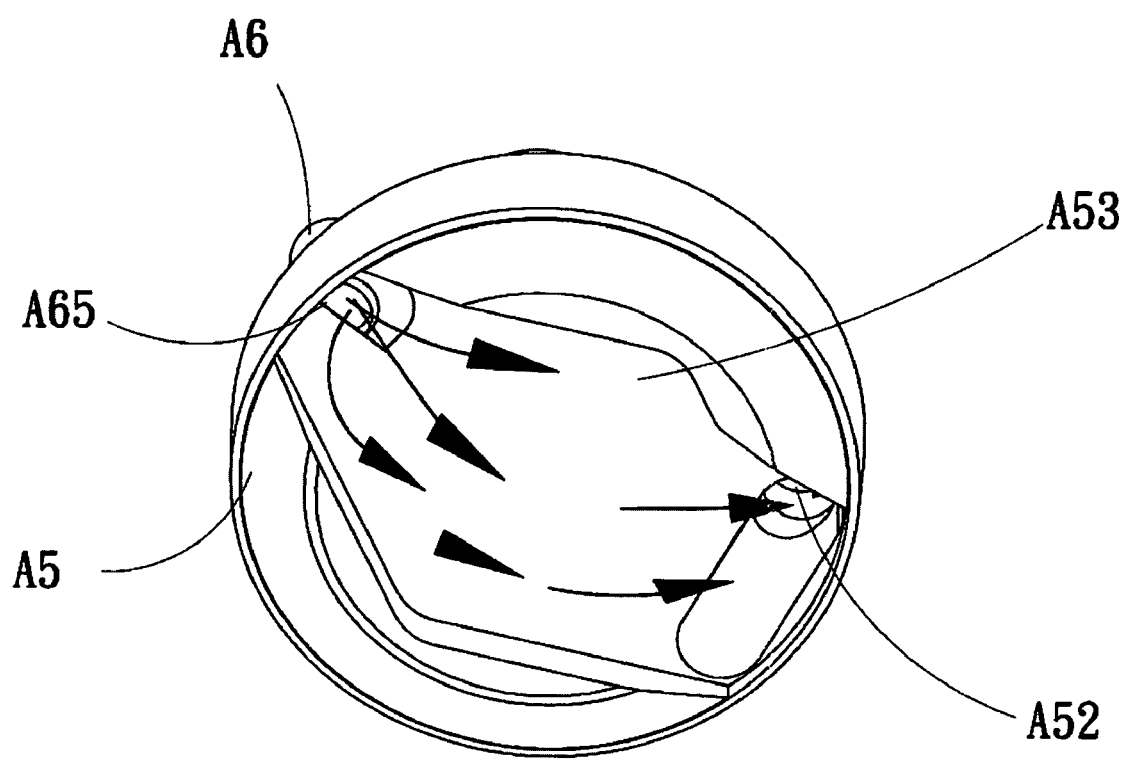
FIG. 8 is a perspective view of the water suction disk illustrating direction of the fluid flow.

Referring to FIG. 8, it can be seen clearly a water chamber A53 at the bottom of the suction disk A5 allows the fluid make a circulative movement after entering the water chamber A53 via the guide port A65 and before leaving the water chamber A53 via the outlet A52 of the suction disk A5.

Figure 9:
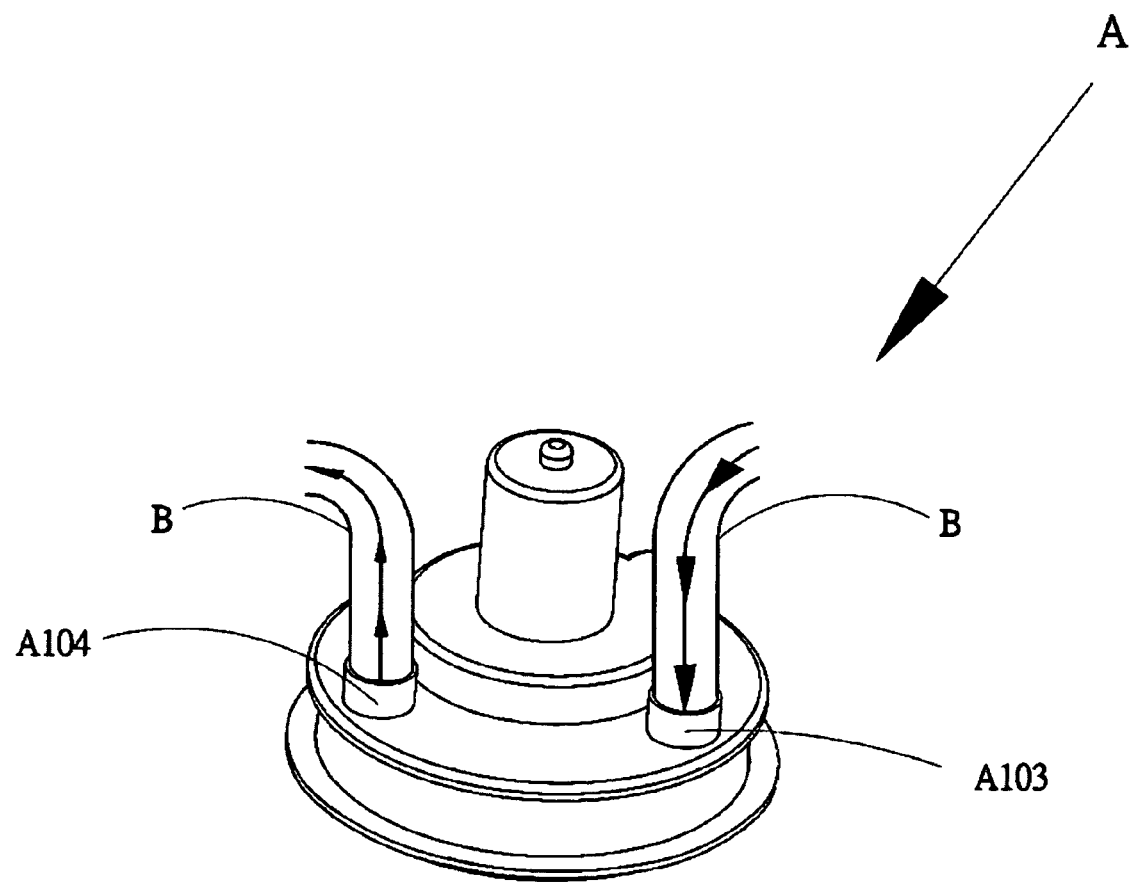
FIG. 9 is a perspective view of the water cooled heat dissipation module illustrating a water guiding tube being joined to the inlet and outlet tubes respectively.

Referring to FIG. 9, a water pipe B is connected to the intake pipe connector A103 to guide the fluid into the flow passages in the heat dissipation module A and the fluid can move to the discharge pipe connector A104 after circulating along the flow passages and leaves the heat dissipation module A via another water pipe B connecting with the discharge pipe connector A104.

It is appreciated that the water cooled heat dissipation module according to the present invention has the following advantages:

1. Heat from the Heat Generating Component can be Dissipated Outward Rapidly:

Due to the base disk A3 of the heat dissipation module A contacting with the heat generating component directly, the heat from the heat generating component can be transmitted to the cooling strips A31 via the base disk A3 immediately such that the heat from the heat generating component can be largely dissipated rapidly by means of the base disk A3 being full of moving water and the cooling strips A31 increasing area of the base disk to contact with the water.

2. Faster Water Circulation can be Obtained:

The guide fan A7 is provided in the heat dissipation module A directly and the fluid in the heat dissipation module A is able to flow faster while the guide fan A7 runs such that the water can move outward and inward the heat dissipation module A more effectively. Meanwhile, the water pipes B can be connected to an external water circulation device to reduce burden of the external circulation device.

While the invention has been described with referencing to the preferred embodiment thereof, it is to be understood that modifications or variations may be easily made without departing from the spirit of this invention, which is defined by the appended claims.

What is claimed is:

1. A water cooled heat dissipation module for an electronic device comprising:

a base disk having a containing space with a plurality of cooling strips providing at the bottom thereof;

a water suction disk being disposed on top of said base disk, providing a water chamber and having an inlet and an outlet next to the periphery thereof, accommodating said cooling strips, having a suction space with a water passage therein to communicate with said inlet;

a water guide being a circular wall and integrally joined to the top of said suction disk eccentrically;

a cover further comprising an intake pipe connector for communicating with said inlet, a discharge pipe connector for communicating with said outlet, a bulge part corresponding to said water guide and a cylindrical receiving shell extending upward from said bulge part; and a guide fan further comprising a cylindrical body part, a plurality of blades and a spindle for being received in said receiving shell and said bulge part;

wherein, a spindle seat is disposed at said water suction disk and concentric with said water guide for joining with an end of said spindle; said spindle passes through said guide fan axially with another end of said spindle joined to a motor disposed next said cover; said water guide has a small circular wall section jutting toward the periphery of said water suction disk; a guide port is disposed at the water suction disk next to said small circular wall section; said spindle seat, said receiving shell and said spindle have a common axis; said bulge part with said receiving shell has the same shape as said guide fan for containing said guide fan; said suction disk has a water hole to communicate with said water passage such that a fluid flow enters said water suction disk via said intake pipe connector and said inlet, moves along said water passage to said blades via said water hole, enters said containing space via said guide port, and flows outward via said outlet and discharge pipe connector.

2. The heat dissipation module as defined in claim 1, wherein a guide opening is provided between every of said blades of said guide fan respectively for guiding the fluid flow to said guide port.

3. The heat dissipation module as defined in claim 1, wherein said water hole is disposed under said blades.

4. The heat dissipation module as defined in claim 1, wherein said intake pipe connector and said discharge pipe connector connect a water pipe made of material with good property of sealing such as rubber pipe.

5. The heat dissipation module as defined in claim 1, wherein said guide port has a mitigating passage for fluid flowing into said containing space less harshly.

* * * * *